United States Patent [19]

Wade et al.

[11] Patent Number: 4,942,111
[45] Date of Patent: Jul. 17, 1990

[54] PRINTING PLATE PRECURSORS

[75] Inventors: John R. Wade, Otley; Jeremy R. Burch, Wilberfoss; Rodney M. Potts, Adel, all of England

[73] Assignee: Vickers PLC, England

[21] Appl. No.: 484,461

[22] Filed: Feb. 22, 1990

Related U.S. Application Data

[63] Continuation of Ser. No. 141,596, Jan. 7, 1988, abandoned.

[30] Foreign Application Priority Data

Jan. 12, 1987 [GB] United Kingdom ............... 8700599

[51] Int. Cl.$^5$ .................................................. G03C 1/76
[52] U.S. Cl. .................................... 430/273; 430/281; 430/961
[58] Field of Search ............... 430/273, 281, 961, 523

[56] References Cited

U.S. PATENT DOCUMENTS

| 4,072,527 | 2/1978 | Fan ........................................ 430/273 |
| 4,072,528 | 2/1978 | Bratt ...................................... 430/273 |
| 4,362,812 | 12/1982 | Minamizono et al. .............. 430/961 |
| 4,507,385 | 3/1985 | Steklenski et al. ................. 430/961 |
| 4,599,299 | 7/1986 | Neiss et al. .......................... 430/961 |
| 4,631,246 | 12/1986 | Bennett ................................ 430/961 |

Primary Examiner—Jack P. Brammer
Attorney, Agent, or Firm—Wood, Phillips, Mason, Recktenwald & Vansanten

[57] ABSTRACT

A printing plate precursor comprises a substrate coated with a radiation sensitive composition overcoated with a barrier layer to prevent oxygen inhibiting photopolymerization of the composition. The barrier layer comprises a polymer and an amphoteric compound.

8 Claims, No Drawings

PRINTING PLATE PRECURSORS

This application is a continuation of application Ser. No. 141,596, filed Jan. 7, 1988, now abandoned.

This invention relates to printing plate precursors, comprising a substrate coated with a radiation sensitive composition for use in lithographic or flexographic printing.

As is well known, printing plate precursors and similar radiation sensitive devices are considered to be either negative-working or positive-working depending on the effect of actinic radiation on the radiation sensitive composition. Most negative-working compositions have in the past been formulated using diazo or azido compounds or photo-crosslinkable materials such as polymeric cinnamate esters, the photochemical properties of which are well established.

In the search for printing plate precursors showing significantly improved processing and printing properties, attention has recently switched to photopolymerisable systems based on compounds containing ethylenic unsaturation. These systems rely on the radiation induced decomposition of photosensitive materials with the resultant generation of highly reactive radical species which initiate the polymerisation of the ethylenic compounds. Polymerisation can then proceed in a self-propagating chain reaction resulting in the production of polymers of high molecular weight. By using multifunctional ethylenic compounds, free radical generation is followed by the rapid production of a dense 3-dimensional network of photopolymerised material which exhibits insolubility in developing solutions and increased wear resistance on the press.

The development of this technology has been hampered by the severe inhibition of polymerisation when exposure is carried out in the presence of oxygen. In the absence of oxygen, the polymerisation reaction is so efficient that printing plate precursors requiring, in some cases, less than 1% of the exposure of conventional systems are obtainable. However, even a low level of oxygen is sufficient to render such systems impractical.

A number of methods of reducing or eliminating the inhibiting effect of oxygen have been disclosed. Carrying out exposure in an inert atmosphere (e.g. nitrogen or argon) is one example. However, very expensive equipment is necessary which makes the method impractical for printing plates. Incorporating a diazo compound into the radiation sensitive composition has also been suggested but this has a considerable effect on the wear properties of the exposed composition. A further suggestion has been to incorporate certain agents, for example triphenylphosphine into the composition, but they have been found to have only a minor effect.

The most effective method is to provide a barrier layer, which is transparent to radiation, but which has low permeability to oxygen, on top of the radiation sensitive composition. The most effective materials for this purpose have been found to be water-soluble polymers such as poly(vinyl alcohol) poly(acrylamide), poly(vinyl pyrrolidone), gum arabic and dextrin. However the resultant overcoated printing plate precursor generally displays inferior shelf life and handling properties compared to precursors based on conventional photosensitive coatings. A relevant factor in this respect is believed to be the presence of moisture in the barrier layer. This moisture, which may either be residual or as a consequence of moisture uptake during storage under conditions of high humidity, appears to cause the generation of randomly dispersed defects in the barrier layer itself, in the radiation sensitive composition and even in the substrate. Defects in the radiation sensitive composition can result in reduced image durability and substrate defects, in the case of a grained and anodised aluminium substrate as is commonly used for lithographic printing plates, can lead to reduced hydrophilicity of the non-image areas.

A further consequence of the presence of moisture is reduced resistance to coating damage during handling, and in particular an increased susceptibility to finger print marking. Although this can be overcome to some extent by the incorporation of dispersed polymer particles which coalesce during drying of the coating used to form the barrier layer as disclosed in U.S. Pat. Nos. 4,072,527 and 4,072,528, the resultant barrier layer has reduced solubility in the preferred aqueous based developing solutions and exhibits slow, flaky development and generates undesirable levels of material in the developer reservoirs of automatic developing machines. Moreover, this developability problem increases with storage.

The effective performance of the barrier layer in preventing oxygen inhibition depends on the maintenance of close contact between the barrier layer and the radiation sensitive composition. Delamination of the barrier layer can be caused during handling by scratching or abrasion and can also occur during plate storage, particularly at elevated temperatures.

It is an object of the present invention to overcome the foregoing disadvantages.

According to the present invention there is provided a printing plate precursor comprising a substrate, a radiation sensitive composition on the substrate comprising an ethylenically unsaturated compound and a photoinitiator and, over the radiation sensitive layer, a barrier layer to prevent oxygen inhibition characterised in that the barrier layer comprises a polymer and an amphoteric compound.

The polymer should be transparent to the radiation to which the radiation sensitive compound is sensitive and a particularly preferred polymer is poly(vinyl alcohol). Preferably the amphoteric compound is polymeric.

The term "amphoteric compound" is defined to mean a compound having one or more basic groups and one or more acidic groups within the same molecule. The basic group(s) may be chosen, for example, from amines, amides, imines, hydrazones, hydrazines and nitrogen containing heterocyclic groups and such groups may be in their quaternised form. The acidic group(s) may be chosen, for example, from carboxylic acid, phosphonic acid, phosphinic acid, phosphate, phosphite, phosphonate, phosphinate, sulphonic acid, sulphinic acid, sulphate and sulphite groups.

The amphoteric compound should be present in an amount sufficient to substantially reduce the formation of the above defects.

Suitable amphoteric compounds are non N-substituted or N-substituted (preferably N-aryl substituted) amino acids such as glycine, N-Phenyl glycine, L-Arginine, L-lysine, L-Serine, L-Cysteine, L-Histidine, 4-Aminobenzoic acid, and 3,5-Diamino benzoic acid. Even very small amounts of such compounds have an effect in reducing the formation of defects. They may thus be present in an amount of from 0.01% to 20% by weight of the barrier, although the preferred range is 0.1% to 5% by weight.

In the case where the amphoteric compound is polymeric, ti may be a copolymer of a basic group-containg monomer and an acidic group-containing monomer. Suitable basic group-containing monomers are acrylamide, N-n-octylacrylamide, N-t-octyl acrylamide, N-t-butyl acrylamide, t-butyl aminoethyl methacrylate, dimethylaminomethyl methacrylate, vinyl imidazole, and allylamine. Suitable acidic group-containing monomers are acrylic acid, methacrylic acid, vinyl phosphonic acid and 2 acrylamido-2-methyl-1-propane sulphonic acid.

The polymeric amphoteric compounds may include one or more neutral monomers such as methyl methacrylate or hydroxypropyl methacrylate. Interpolymers derived from N-alkyl (meth)acrylamide, an acidic monomer and at least one other monomer, such as are disclose in U.S. Pat. No. 3,927,199, are particularly suitable. Such polymeric compounds may be present in an amount from about 5% to 90% by weight of the barrier layer. However, the oxygen permeability increases with increasing amounts of such compounds and a preferred range therefore is from 5% to 50% by weight.

The degree of usefulness of the various amphoteric compounds depends partly on their solubility in the solvent used to dissolve the polymer when applying the barrier layer. In some cases this solubility may be enhanced by neutralisation of some or all of the acidic groups by a base. The preferred use of volatile bases allows efficient removal of the base from the barrier layer during the subsequent drying stage. The base may be inorganic, for example ammonia, sodium hydroxide, lithium hydroxide or sodium metasilicate or organic, for example triethylamine, ethanolamine, N-methyl morpholine, L-Arginine, L-Lysine, 2-dimethylamino ethanol, N-methyldiethanol amine, tetramethylammonium hydroxide, 2-amino-2-methyl-1,3-propanediol or trishydroxy methyl amino methane. Generally, the coating weight of the barrier layer should be at least 0.1 g/m$^2$ in order to obtain the desired effect. The thicker the barrier layer the greater the protection from oxygen inhibition. However thicker layers are more difficult to remove during subsequent processing of the precursor. Thus, it is preferred for the coating weight to be from 0.5 to 5.0 g/m$^2$.

Particularly suitable ethylenically unsaturated compounds for the radiation sensitive composition are addition polymerisable compounds. Preferred are simple compounds, or monomers as they are sometimes denominated, containing ethylenic unsaturation, as well as polymers containing end groups or pendant groups terminating with ethylenic unsaturation. For example, the phrase "addition polymerisable compound" is intended to include polymers having recurring units with the structure:

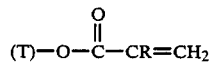

wherein T is any group capable of forming the backbone of a polymer and R is hydrogen or methyl.

Other examples of useful addition polymerisable compounds containing ethylenic unsaturation include monomeric (meth)acrylates, (meth)acrylamides, allyl compounds, vinyl ethers, vinyl esters, N-vinyl compounds, styrenes, acrylonitriles and crotonates. Many examples of each of these classes are well known, such as those listed for example in British Patent Specification No. 1534137.

A highly preferred class of addition polymerisable compounds containing ethylenic unsaturation encompasses the (meth)acrylate compounds. Particularly useful examples include alkyl (meth)acrylates containing from 1 to 30, and most preferably 1 to 5, carbon atoms in the alkyl portion, such as methyl and ethyl (meth)acrylate; pentaerythritol tri-and tetra (meth)acrylates; esters of polyols including glycol di(meth)acrylates, such as tripropylene glycol diacrylate, tetraethylene glycol diacrylate and triethylene glycol dimethacrylate; alkanediol di(meth)acrylates such as hexanediiol di(meth)acrylates; polyether di(meth)acrylates; urethane (meth)acrylates such as the reaction products of hydroxy group containing (meth)acrylates with di or polyisocyanates; epoxy (meth)acrylates; and mixtures of the above.

Preferred photoinitiators include, but are not limited to the following examples. The class of homolytic photoinitiators derived from substituted benzoins or acetophenones; acetophenone, dimethoxy acetophenone, diethoxy acetophenone, bis(2-propoxy acetophenone), α,α- dimethyl-α-hydroxy acetophenone, 1-benzoylcyclohexanol, benzoin, benzoin acetate, benzoin methyl ether, benzoin ethyl ether, α,α-dimethoxy-α-phenyl acetophenone. Other homolytic photoinitiators include acyloxime esters, acylphosphine oxides such as 2,4,6-trimethyl benzoyl diphenyl phosphine oxide, acryl phosphonates such as diethyl benzoyl phosphonate and 2-methyl-1- 4-(methyl thio)phenyl -2-morpholino-propan-1-one. Photoreducible aromatic ketones are another applicable class of photoinitiators which include as examples benzophenone, 4-4'-bis(N,N-dimethylamino) benzophenone, 4-4'-bis(N,N-diethylamino) benzophenone, fluorenone, benzil, thioxanthone, 2-chlorothioxanthone and 2-isopropyl thioxanthone. These photoreducible aromatic ketones are most effective when used in the presence of hydrogen donor molecules such as alcohols, ethers, amines, thiols, sulphides and phenols.

Onium salts which produce radicals and/or cations and/or radical cations on irradiation are also applicable and include aryldiazonium salts, quaternary ammonium salts, diaryl iodonium salts, triaryl sulphonium salts, triaryl selenonium salts, tetra aryl phosphonium salts, oxosulphonium salts and ferrocenium salts. These salts can be used in conjunction with dye sensitisers such as acridine orange, acridine yellow, benzoflavin and setoflavin T.

More specifically preferred photoinitiators are triazines such as 2,4,6 tris-trichloro methyl-s-triazine which may be used in conjunction with synergists such as 4,4'-bis(N,N-dimethyl amino) benzophenone, N-methyl-2-benzoyl-β-naphthiazoline and 7,7'-bis(N-N-diethyl amino)-3-keto coumarin. Also preferred are peresters as referred to in EP No. 125140 and trichloromethyl phenacylidenes as referred to in EP No. 135348.

The radiation sensitive composition may include a substance which exhibits a colour change when the composition is exposed to radiation. Thus, the substance may be a dye, dye precursor or indicator which becomes bleached or otherwise changes colour in the presence of acidic photolysis products or which is caused to become coloured by oxidation as a consequence of the exposure to radiation of the composition. Such colour changes are particularly important in the production of lithographic printing plates from radiation sensitive plates since they provide a visible distinction between the image and non-image areas after image-wise exposure. However, in the presence of such colour change material, the aforementioned defects ordinarily become more readily observable due to pre-triggering or differential photo-triggering of the colour change in the area of the defect.

The substrate may be any substrate conventionally used with photoresists or in the production of lithographic printing plates and a substrate formed from grained and anodised aluminium is particularly preferred.

If desired, a polymeric binder may be incorporated in the radiation sensitive composition to strengthen the composition and improve the adherence of the composition to the substrate. Typical binders are acrylic polymers, vinyl acetate polymers, and novolak resins. Many examples of suitable polymers are listed in the patent literature and reference may be made, for example, to U.S. Pat. Nos. 3,652,275 and 4,268,667 and GB published Patent Application No. 2006775.

The following Examples illustrate the invention:

EXAMPLE 1

An electrolytically grained and anodised aluminium sheet was coated with a solution, in ethyl methyl ketone, of a radiation sensitive composition comprising 3 parts by weight of the dimethacrylate ester of the glycidyl ether of Bisphenol A, 1 part by weight of a vinyl acetate/crotonic acid copolymer, 0.15 parts by weight of 1,3,3-trimethyl-2-(4'-trichloromethyl benzoyl) methylene 5-chloroindoline, and 0.15 parts by weight of 4-dimethylaminoazo benzene.

The coating weight was 1 gm per sq.m. After drying, the radiation sensitive coating was over coated with a 20% solids solution in water of poly(vinyl alcohol) and dried to form a barrier layer of coating weight 1.5 g/m² on top of the radiation sensitive coating.

Further printing plate precursors were prepared in the same way but with additions of amphoteric compounds to the poly(vinyl alcohol) solution. All the printing plate precursors were subjected to accelerated ageing tests by being stored at 30 degC and 95% relative humidity and then exposed to u.v. radiation in a printing down frame. The results of this are shown in Table 1. Measurements were carried out on plates having an area of 200 cm². The defects appeared as dark spots on a pale background.

TABLE 1

| Amphoteric Additive | % w/w in relation to PVA | Number of defects visible after | | |
|---|---|---|---|---|
| | | 7 days | 21 days | 35 Days |
| None | — | 34 | 106 | 144 |
| Glycine | 1 | 3 | 2 | 2 |
| Glycine | 2 | 2 | 4 | 6 |
| Glycine | 3 | 3 | 1 | 6 |
| L-Arginine | 2 | 3 | 2 | 2 |
| L-Lysine | 2 | 2 | 1 | 2 |
| L-Serine | 2 | 2 | 4 | 9 |
| L-Cysteine | 2 | 4 | 4 | 6 |
| N-Phenyl Glycine | 2 | 4 | 7 | 8 |

The plates were then developed in aqueous alkaline developer.

The presence of the amphoteric agent had no effect on the speed of the plate, the colour change of the exposed plate, or the run length when press testing was carried out.

EXAMPLE 2

Example 1 was repeated except that a polymeric material was used as the amphoteric compound. The overcoating solution was prepared by adding the polymeric amphoteric compound to water to form a suspension, adding sufficient ammonia (to increase the solubility of the amphoteric polymer) until a clear solution was obtained, and finally adding poly(vinyl alcohol). The results are shown in Table 2.

TABLE 2

| Amphoteric Additive | % w/w in relation to PVA | Number of defects visible after | | |
|---|---|---|---|---|
| | | 7 Days | 21 Days | 35 Days |
| A | 25 | 1 | 0 | 2 |
| A | 10 | 0 | 0 | 2 |
| B | 25 | 0 | 2 | 1 |
| B | 10 | 0 | 0 | 2 |
| C | 25 | 0 | 1 | 1 |
| C | 10 | 1 | 0 | 2 |
| D | 25 | 0 | 3 | 5 |
| D | 10 | 2 | 1 | 3 |
| E | 25 | 0 | 2 | 4 |
| E | 10 | 0 | 2 | 1 |
| F | 25 | 0 | 0 | 2 |
| F | 10 | 1 | 0 | 3 |
| G | 25 | 1 | 1 | 2 |
| G | 10 | 0 | 1 | 2 |
| H | 25 | 1 | 1 | 1 |
| H | 10 | 0 | 1 | 1 |
| I | 25 | 0 | 2 | 2 |
| I | 10 | 2 | 2 | 4 |
| J | 25 | 0 | 2 | 1 |
| J | 10 | 1 | 2 | 3 |
| K | 5 | 1 | 0 | 2 |
| K | 10 | 0 | 1 | 0 |
| K | 25 | 0 | 0 | 0 |
| K | 40 | 0 | 0 | 0 |
| L | 25 | 0 | 2 | 5 |
| L | 10 | 2 | 2 | 2 |
| M | 25 | 2 | 2 | 3 |
| M | 10 | 0 | 1 | 1 |
| N | 25 | 15 | 50 | 85 |
| O | 25 | 21 | 65 | 94 |

The amphoteric polymers A to J in Table 2 had the following constitution

| Monomer | % by weight in polymer | | | | | | | | | |
|---|---|---|---|---|---|---|---|---|---|---|
| | A | B | C | D | E | F | G | H | I | J |
| N-t-Octylacrylamide | 40 | | | | 41 | 40 | | | | |
| Acrylic acid | 15 | 34 | 25 | | 22 | 15 | 40 | | 42 | |
| Methyl methacrylate | 35 | 42 | 43 | 36 | 37 | 35 | 45 | 43 | 33 | 48 |
| Hydroxypropyl methacrylate | 5 | | | | | 5 | 5 | | | |
| t-Butylaminoethyl methacrylate | 5 | | | | | | | | | |
| N-t-Butylacrylamide | | 24 | 32 | | | | | | | |
| Methacrylic acid | | | | 25 | | | | 42 | | 32 |
| N-n-Octylacrylamide | | | | 39 | | | | | | |
| Dimethylaminomethyl methacrylate | | | | | | 5 | 10 | | | |
| 1-vinylimidazole | | | | | | | | 15 | | |
| Allylamine | | | | | | | | | | 20 |
| Acrylamide | | | | | | | | | 25 | |

Polymer K is an example of a commercially available amphoteric polymeric compound (marketed by National Starch and Chemical Co under the name Amphomer) and is believed to be of similar composition to Polymer A. Polymer L is an interpolymer of acrylamide (20%), vinyl phosphonic acid (50%) and methyl methacrylate (30%) and Polymer M is an interpolymer of N-t-octylacrylamide (25%), 2-acrylamido-2-methyl-1-propane sulphonic acid (40%) and methyl methacrylate (35%). Polymers N and O are non-amphoteric materials (vinyl acetate/crotonic acid copolymer and vinyl acetate/vinyl versatate/crotonic acid copolymer respectively) and were included for reference purposes.

EXAMPLE 3

Example 1 was repeated except that Leuco Malachite Green was used in place of the 4-dimethylaminoazobenzene to produce the colour change.

The only difference was that the defects appeared as green spots on a yellow background.

EXAMPLE 4

Examples 1 and 2 were repeated except that the poly(vinyl alcohol) in the barrier layer was replaced by poly(acrylamide) and poly(vinylpyrrolidone). similar results were obtained.

EXAMPLE 5

Examples 1 and 2 were repeated using various combinations of unsaturated compound, initiator and binder resin as set out in Examples 1 and 2 and Tables I and II of European Patent Application No. 87307437.1.

These variations had no effect on the reduction of defects in the barrier layer.

EXAMPLE 6

Example 2 was repeated except that the neutralisation was carried out using sodium hydroxide, sodium metasilicate, ethanolamine and L-lysine instead of ammonia.

Whilst the effect on defects was similar to the use of ammonia, the colour change on exposure of the plate after ageing had less contrast.

EXAMPLE 7

The foregoing Examples were repeated using barrier layers having a range of thicknesses $\geq 0.1$ g/m$^2$ A similar reduction in defects occurred in each case.

EXAMPLE 8

Example 1 was repeated twice except that the ratio of dimethyl acrylate ester to the copolymer binder was 1:1. In one case, the amphoteric compound was Polymer K (Table 2) in an amount of 5% and in the other case no amphoteric compound was included. Each plate precursor was cut into pieces of size 5 cm×5 cm and the barrier layer of each piece was scored using a sharp knife to form squares of size 0.4 cm×0.4 cm. Each piece was covered with adhesive tape which was then removed quickly. In the case of the precursor without Polymer K only from 10 to 20% of the barrier layer remained whereas 75 to 85% of the barrier layer remained in the case of the precursor containing Polymer K.

We claim:

1. A printing plate precursor comprising:
a substrate;
a radiation sensitive layer on the substrate comprising a composition of an ethylenically unsaturated compound and a photoinitiator; and
a barrier layer on said radiation sensitive layer for preventing oxygen inhibition of said radiation sensitive layer, said barrier layer consisting essentially of a first component which is a water soluble transparent polymer having low permeability to oxygen and selected from the group consisting of polyvinyl alcohol, polyacrylamide, polyvinyl pyrrolidone, gum arabic and dextrin and a second component which is an amphoteric polymeric material having basic groups selected from the groups consisting of amine groups, amide groups, imine groups, hydrazone groups, hydrazine groups, nitrogen containing heterocyclic groups and quaternized forms of such groups and acidic groups selected from carboxylic acid groups, phosphonic acid groups, phosphinic acid groups. phosphate groups, phosphite groups, phosphonate groups, phosphinate groups, sulphonic acid groups, sulphinic acid groups, sulphate groups, and sulphite groups.

2. A printing plate precursor as claimed in claim 1 wherein the amphoteric polymeric material is a copolymer of an acidic group containing monomer and a basic group containing monomer.

3. A printing plate precursor as claimed in claim 2 wherein the basic group-containing monomer is an N-alkyl (meth) acrylamide and the amphoteric compound is an interpolymer of the N-alkyl (meth) acrylamide, the acidic group-containing monomer, and at least one other monomer.

4. A printing plate as claimed in claim 1 wherein the barrier layer is present in a coating weight of from 0.5 to 5.0 g/m$^2$.

5. A printing plate precursor as claimed in claim 2 wherein at least some of the acidic groups of the acidic group containing monomer have been neutralized with a base.

6. A printing plate precursor as recited in claim 1 wherein said barrier layer polymer is present in the barrier layer in an amount from 10 to 95 percent by weight of the barrier layer and said amphoteric polymeric material is present in the barrier layer in an amount from 5 to 90 percent by weight of the barrier layer.

7. A printing plate precursor comprising:
a substrate;
a radiation sensitive layer on the substrate comprising a composition of an ethylenically unsaturated compound and a photoinitiator; and
a barrier layer on said radiation sensitive layer for preventing oxygen inhibition of said radiation sensitive layer, said barrier layer consisting essentially of a first component which is a water soluble transparent polymer having low permeability to oxygen and selected from the group consisting of polyvinyl alcohol, polyacrylamide, polyvinyl pyrrolidone, gum arabic and dextrin and a second component which is an amphoteric polymeric material having basic groups selected from the groups consisting of amine groups, amide groups, imine groups, hydrazone groups, hydrazine groups, nitrogen containing heterocyclic groups and quaternized forms of such groups and acidic groups selected from carboxylic acid groups, phosphonic acid groups, phosphinic acid groups, phosphate groups, phosphite groups, phosphonate groups, phosphinate groups, sulphonic acid groups, sulphinic acid groups, sulphate groups, and sulphite groups, wherein a surface of said barrier layer constitutes a free surface of said precursor.

8. A printing plate precursor as recited in claim 7 wherein said barrier layer polymer is present in the barrier layer in an amount from 10 to 95 percent by weight of the barrier layer and said amphoteric polymeric material is present in the barrier layer in an amount from 5 to 90 percent by weight of the barrier layer.

* * * * *